United States Patent [19]

Shimizu et al.

[11] Patent Number: 5,189,312

[45] Date of Patent: Feb. 23, 1993

[54] MULTIPLEXER CIRCUIT HAVING A SIMPLIFIED CONSTRUCTION AND REDUCED NUMBER OF PARTS

[75] Inventors: Katsuya Shimizu, Kasugai; Tomoaki Ito, Nagoya, both of Japan

[73] Assignees: Fujitsu Limited, Kawasaki; Fujitsu VLSI Limited, Kasugai, both of Japan

[21] Appl. No.: 705,557

[22] Filed: May 24, 1991

[30] Foreign Application Priority Data

May 25, 1990 [JP] Japan ................................ 2-135659

[51] Int. Cl.⁵ .......................... H03K 17/56; H03K 5/22
[52] U.S. Cl. ..................................... 307/243; 307/264; 307/268; 307/357; 307/364; 328/186; 341/144
[58] Field of Search ............... 307/243, 264, 268, 364, 307/357; 328/186; 341/144

[56] References Cited

U.S. PATENT DOCUMENTS

| 3,400,257 | 9/1968 | Smith | 341/144 |
| 4,523,155 | 3/1985 | Walczak et al. | 330/279 |
| 5,045,804 | 9/1991 | Sugawara et al. | 307/243 |

FOREIGN PATENT DOCUMENTS 0116328 9/1981 Japan .

OTHER PUBLICATIONS

"The Art of Electronics" Horowitz et al., p. 51 Cambridge University Press, 1980.

Primary Examiner—William L. Sikes
Assistant Examiner—Margaret Rose Wambach
Attorney, Agent, or Firm—Staas & Halsey

[57] ABSTRACT

A multiplexer circuit comprises a plurality of voltage generation circuits which produce corresponding output voltages having respective, different voltage levels in accordance with an ordered sequence thereof, from the lowest to the highest level. The outputs of the plurality of voltage generation circuits are supplied to a common output line. A decoder circuit receives a control data input signal which designates a selected one of the plurality of levels of the output signal and produces a signal for disabling each of the voltage generating circuits having an output voltage level of a higher order than that of the voltage generating circuit producing the output voltage of the selected level designated by the control data input signal. Voltage generating circuits of lower order need not be disabled.

11 Claims, 5 Drawing Sheets

MULTIPLEXER CIRCUIT HAVING A SIMPLIFIED CONSTRUCTION AND REDUCED NUMBER OF PARTS

BACKGROUND OF THE INVENTION

The present invention generally relates to multiplexer circuits and in particular to a multiplexer circuit for producing a plurality of output voltages selectively in response to control data.

In the semiconductor integrated circuits, efforts are made to reduce the number of devices in the circuit and hence the cost of the integrated circuit while maintaining the full function of the circuit. The multiplexer circuit for use in the mobile telephones such as portable telephones or automobile telephones is no exception.

FIG. 1 is a circuit diagram showing a conventional multiplexer circuit that is used in the portable telephones.

Referring to FIG. 1, an input radio frequency signal $RF_{in}$ is supplied to an input terminal $11a$ of a power amplifier 11 for amplification, and the power amplifier 11 produces an output signal $RF_{out}$ at an output terminal $11b$. Further, the power amplifier 11 has a control terminal $11c$ for receiving a gain control signal VAPc, and the gain of the power amplifier 11 is controlled in response to the gain control signal VAPc at the control terminal $11c$.

In order to control the gain of the power amplifier 11, there is provided a differential amplifier 12 having a non-inverting input terminal to which the output signal $RF_{out}$ is supplied from the power amplifier 11 after rectification and smoothing in a diode $12a$ and an RC filter circuit $12b$. The differential amplifier 12 is further supplied with a reference signal MPOUT at an inverting input terminal thereof, and produces the gain control signal VAPc in response to the difference between the signal at the non-inverting input terminal and the signal at the inverting input terminal.

The reference signal MPOUT is produced by a multiplexer circuit 13 that is supplied with external control data CONTROL at input terminals $c_1$, $c_2$ and $c_3$ in response to the combination of the logic states of the control data. Thus, the level of the reference signal MPOUT is changed and the level of the control signal VAPc is changed in response thereto. In other words, the power amplifier 11 of FIG. 1 produces the output signal RFOUT with a variable gain that is specified by the control data at the input terminals $c_1$–$c_3$ of the multiplexer circuit 13.

In the illustrated example, the control data supplied to the multiplexer 13 is the three-bit data in correspondence to the three input terminals $c_1$–$c_3$. In response to the eight possible combinations specified by the three-bit data, there are eight reference voltages $v_1$–$v_8$ that are produced by the voltage-dividing function of a reference voltage $V_{REF}$ by resistors $X_1$–$X_8$ and supplied to the multiplexer 13. Thus, the output level of the signal RFout can be changed by eight possible levels. Of course, the number of bits of the control data CONTROL is not limited to three.

FIG. 2 shows the circuit construction employed conventionally for the multiplexer 13. In this example, it should be noted that there are only two input terminals, c1 and c2, for the control data CONTROL. Thus, the circuit of FIG. 1 that uses the multiplexer of FIG. 2 is capable of changing the gain of the power amplifier 11 by only four levels. In correspondence to the four levels for the gain adjustment, there are four reference voltages $v_1$–$v_4$ instead of eight reference voltages $v_1$–$v_8$ of FIG. 1.

Referring to FIG. 2, there are four input terminals $Ti_1$–$Ti_4$ in correspondence to four circuits $1a$–$1d$ for receiving the four reference voltages $v_1$–$v_4$. In correspondence to each input terminal there is an NPN transistor for receiving the reference voltage at a base thereof. For example, the input terminal $Ti_4$ of the circuit $1d$ is connected to a base of an NPN transistor $Tr_1$. The NPN transistor $Tr_1$ has an emitter connected to an emitter of a PNP transistor $Tr_2$ that forms a current mirror circuit together with another PNP transistor $Tr_3$.

The PNP transistors $Tr_2$ and $Tr_3$ have respective bases connected commonly with each other to an emitter of an NPN transistor $Tr_5$ that in turn forms another current mirror circuit with an NPN transistor $Tr_4$. There, the transistor $Tr_4$ and the transistor $Tr_5$ have respective bases connected commonly to a constant current source $2a$ and respective emitters connected commonly to the ground. Thereby, the transistors $Tr_4$ and $Tr_5$ are normally turned on by the base current supplied from the constant current source $2a$, unless the base of the transistors $Tr_4$ and $Tr_5$ is connected to the ground. When the transistor $Tr_5$ is turned on, the transistors $Tr_2$ and $Tr_3$ are turned on because of the increased base-emitter voltage.

Further, the transistor $Tr_1$ has a collector connected to a collector of a PNP transistor $Tr_6$ that in turn has a base connected to its collector and an emitter connected to a voltage source Vcc. The transistor $Tr_3$ has an emitter connected to the emitter of an NPN transistor $Tr_9$ that in turn has a base connected to an output terminal to for outputting the signal MPOUT and further to the ground via another current source $2b$. The transistor $Tr_9$ has a collector that is connected to a collector of a PNP transistor 7 that forms a current mirror together with the PNP transistor $Tr_6$. Thus, the transistor $Tr_7$ has a base connected commonly to the base and hence the collector of the transistor $Tr_6$, and an emitter connected to the voltage source Vcc. Further, there is another transistor $Tr_8$ that has a collector connected to the voltage source Vcc, a base connected on the one hand to the collector of the transistor $Tr_7$ and on the other hand to the collector of the transistor $Tr_9$, and an emitter connected on the one hand to the base of the transistor $Tr_9$ and on the other hand to the ground via the constant current source $2b$.

In operation, the transistor $Tr_1$ is turned on in response to the input voltage $v_4$ and in turn induces the turning-on of the transistors $Tr_6$ and $Tr_7$. Here, it is assumed that the transistors $Tr_2$–$Tr_5$ are in the turned-on state. In response to the turning-on of the transistor $Tr_1$, the transistors $Tr_6$ and $Tr_7$ are turned on, and in response to the turning-on of the transistor $Tr_7$, the transistors $Tr_8$ and $Tr_9$ are turned on. In this state, the sum of the voltage drops caused across the base and emitter of the transistors $Tr_1$ and $Tr_2$ becomes equal to the sum of the voltage drops across the base and emitter of the transistors $Tr_3$ and $Tr_9$. In other words, a voltage equal to the voltage $v_4$ is obtained at the output terminal To as the voltage MPOUT. As the construction and operation for other circuits $1a$–$1c$ are identical with those described above, the description thereof will be omitted.

In order to obtain one of the voltages $v_1$–$v_4$ selectively at the output terminal To as the output voltage MPOUT, a decoder circuit 3 is connected for selectively enabling one of the circuits $1a$–$1d$. The decoder circuit includes transistors $Tr_{11}$ and $Tr_{12}$ having respective bases connected to the input terminals $c_1$ and $c_2$. The transistor $Tr_{11}$ has a collector connected to the voltage source Vcc via a constant current source $2c$ and an emitter connected to the ground, while the transistor $Tr_{12}$ has a collector connected to the voltage source Vcc via a constant current source $2d$ and an emitter connected to the ground. Further, in order to enable the circuits $1a$–$1d$, transistors $Tr_{13}$–$Tr_{20}$ are provided, wherein the transistors $Tr_{13}$ and $Tr_{14}$ selectively enable the circuit $1a$, the transistors $Tr_{15}$ and $Tr_{16}$ selectively enable the circuit $1b$, the transistors $Tr_{17}$ and $Tr_{18}$ selectively enable the circuit $1c$, and the transistors $Tr_{19}$ and $Tr_{20}$ selectively enable the circuit $1d$.

It should be noted that the transistors $Tr_{19}$ and $Tr_{20}$ have bases respectively connected to the collector of the transistor $Tr_{11}$ and the collector of the transistor $Tr_{12}$. Further, collectors of the transistors $Tr_{19}$ and $Tr_{20}$ are connected commonly to the bases of the transistors $Tr_4$ and $Tr_5$. Emitters of the transistors $Tr_{19}$ and $Tr_{20}$ in turn are connected commonly to the ground. Thereby, at least one of the transistors $Tr_{19}$ and $Tr_{20}$ is turned on when the logic level of the control data CONTROL at the input terminals $c_1$ and $c_2$ is any of (L, L), (H, L), and (L, H), where the first letter in the parentheses represents the logic level of the input terminal $c_1$, the second letter in the parentheses represents the logic level of the input terminal $c_2$, L represents the low level state, and H represents the high level state. Only when the control data has the state (H, H) are the transistors $Tr_{19}$ and $Tr_{20}$ both turned off. This means that the respective bases of the transistors $Tr_4$ and $Tr_5$ are both grounded unless there is the control data (L, L) at the input terminals $c_1$ and $c_2$. In other words, the foregoing operation of the circuit $1d$ to produce the voltage $v_4$ at the output terminal To is obtained only when the input control data CONTROL has the high level state H at both input terminals $c_1$ and $c_2$. Otherwise, the base of the transistors $Tr_4$ and $Tr_5$ is held at the ground level. Similarly, the circuits $1a$–$1c$ are selectively enabled in response to the combination of the logic levels of the bits of control data CONTROL at the input terminals $c_1$ and $c_2$.

This circuit of FIG. 2 has an obvious problem of a complex circuit construction and a large number of parts. It will be easily understood that the number of transistors in the decoder circuit 3 increases steeply with an increasing number of different voltage levels in the output voltage MPOUT. For example, when there are three input terminals $c_1$–$c_3$ in correspondence to the three-bit control data as illustrated in FIG. 1, one needs twenty-seven transistors in the decoder 3 as compared to the ten transistors $Tr_{11}$–$Tr_{20}$ in the example of FIG. 2. It should be noted that the increase in the number of transistors occurs also in the circuits $1a$, $1b$, . . . . Thus, the conventional multiplexer circuit has suffered from the problem that the number of voltage levels that are selectively produced is limited.

SUMMARY OF THE INVENTION

Accordingly, it is a general object of the present invention to provide a novel and useful integrated multiplexer circuit wherein the foregoing problems are eliminated.

Another object of the present invention is to provide a multiplexer circuit for producing a voltage output having a level that is selected from a number of voltage levels in response to coded binary data, wherein the circuit construction is simplified and the number of parts reduced.

Another object of the present invention is to provide a variable-gain amplifier system in which the gain of the amplifier system can be selectively adjusted to a number of different gain levels.

Another object of the present invention is to provide a multiplexer circuit for producing an output voltage having a voltage level selected from a number of different, predetermined voltage levels in response to binary coded data, comprising a plurality of voltage generators each producing a predetermined output voltage, each different from the others, on a common output line, each of said voltage generators being designated by a corresponding binary code represented by a plurality of binary digits of first and second logic levels, and decoder means supplied with the binary coded data for selectively disabling one or more of the voltage generators, wherein the decoder means comprises logic gate means provided in correspondence to each of the voltage generators, said logic gate means disabling the cooperating voltage generator when the binary coded data supplied to the decoder means includes the binary digits of the first logic level that agree with the binary digits of the first logic level representing the binary code of the voltage generator to which the logic gate means cooperates. According to the present invention, the decoder means is realized simply by diodes and bit lines, and the complexity of the circuit construction is significantly reduced even when the number of digits included in the binary coded data is increased in correspondence to an increased number of voltage levels. Associated therewith, a desirable effect of reducing the number of devices is achieved.

Other objects and further features of the present invention will become apparent from the following detailed description when read in conjunction with the attached drawings.

BRIEF DESCRIPTION OF THE DRAWINGS

FIG. 6 is a circuit diagram showing a part of the multiplexer according to a third embodiment of the present invention.

DETAILED DESCRIPTION

First, the principle of the present invention will be described with reference to FIG. 3.

Figure 3:
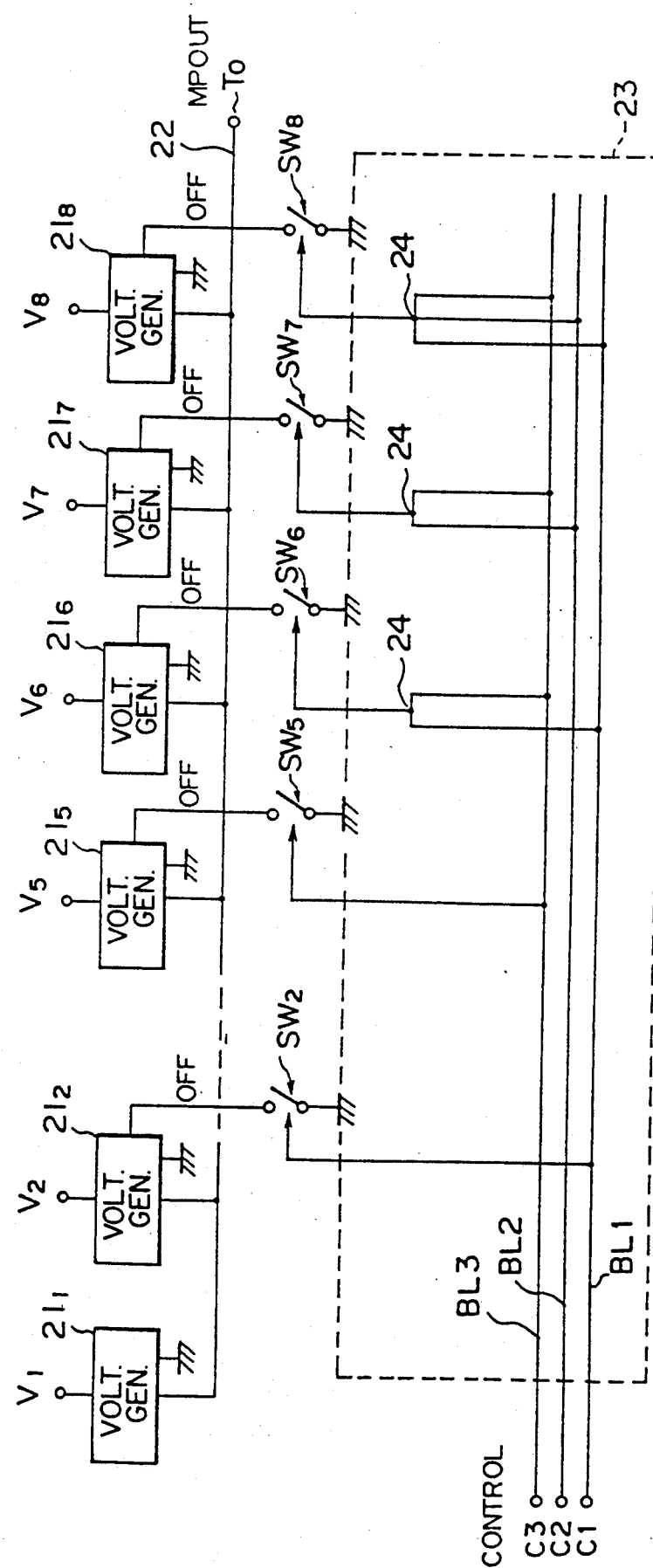
FIG. 3 is a block diagram showing the principle of the present invention.

Referring to FIG. 3, there are provided a plurality of voltage generators ("VOLT.GEN.") $21_1$–$21_8$ that produce, respectively, the voltages $V_1$–$V_8$ on a line 22 that is connected to the output terminal TO. Here, the voltages $V_1$–$V_8$ have corresponding voltage levels which are set to satisfy the relationship $$V_1<V_2<V_3<V_4<V_5<V_6<V_7<V_8.$$

It should be noted that the number of voltage generators $21_1$–$21_8$ and hence the number of voltages $V_1$–$V_8$ is not limited to eight.

Each of the voltage generators $21_2$–$21_8$, except for the voltage generator $21_1$, is disabled selectively by a corresponding switch circuit such as $SW_2$–$SW_8$, and the switch circuits $SW_2$–$SW_8$ are driven by a decoder 23 in response to the control data CONTROL supplied to the input terminals $c_1$–$c_3$ of the decoder 23. Here, it should be noted that the voltage generator $21_1$ that produces the lowest voltage $V_1$ is always enabled and therefore the voltage $V_1$ is always on the output line 22. Thereby, the output voltage on the output terminal To becomes $V_1$, provided that there is no output voltage from the other voltage generators $21_2$–$21_8$.

On the other hand, the voltage generator $21_2$ outputs the voltage $V_2$ on the line 22, in addition to the voltage $V_1$, unless the switch circuit $SW_2$ is activated (i.e., closed). Thereby, the voltage obtained at the output terminal To becomes equal to $V_2$, provided that there is no higher voltage outputted on the line 22. This activation of the switch circuit $SW_2$ occurs in response to the low level signal on a bit line BL1 that is connected to the input terminal $c_1$. It should be noted that such an activation of the switch circuit $SW_2$ occurs when the input control data CONTROL has the value of any of (L, H, H), (L, L, H), (L, H, L) and (L, L, L), where the first digit represents the logic level of the signal on the bit line BL1, the second digit represents the logic level of the signal on the bit line BL2, and the third digit represents the logic level of the signal on the bit line BL3. Similarly, the voltage generator $21_5$ outputs the voltage $V_5$ on the line 22 unless the switch circuit $SW_5$ is activated. Thereby, the output voltage MPOUT at the output terminal To assumes the value of $V_5$, irrespective of whether the voltage generators $21_1$–$21_4$ output the lower voltages such as $V_1$–$V_4$ on the line 22 and as long as the higher voltages $V_6$–$V_8$ are not outputted on the line 22. The activation of the switch $SW_5$ occurs in response to each of the logic states of the data CONTROL of (H, H, L), (H, L, L), (L, H, L), (L, L, L).

The voltage generator $21_6$ outputs the voltage $V_6$ on the line 22 unless the switch $SW_6$ is activated. Such an activation of the switch $SW_6$ occurs when the data CONTROL has the logic state of (L, H, H), (L, H, L), (L, L, H), (H, H, L), (H, L, L), (L, L, L). Similarly, the voltage generator $21_7$ outputs the voltage $V_7$ on the line 22 unless the switch $SW_7$ is activated. The activation of the switch $SW_7$ occurs when the data CONTROL has the logic state of (H, L, L), (L, H, L), (H, H, L), (H, L, H), (L, L, L). Further, the voltage generator $21_8$ outputs the highest voltage $V_8$ on the line 22 unless the switch $SW_8$ is activated. This activation of the switch circuit $SW_8$ occurs when the data CONTROL has the logic states of any of (L, L, L), (H, L, L), (L, H, L), (L, L, H), (L, H, H), (H, L, H), (H, H, L).

In this construction having the output line 22 in common between the voltage generators $21_1$–$21_8$, the voltage MPOUT obtained at the output terminal TO is the highest voltage that is outputted by the corresponding highest voltage level voltage generator on the line 22, even when there are a number of voltage generators enabled simultaneously. For example, when the switch $SW_8$ is opened and the voltage generator $21_8$ thus is enabled, the output voltage MPOUT at the output terminal To becomes equal to the voltage $V_8$ even when the other voltage generators such as $21_6$ and $21_7$ are simultaneously enabled. This means that the construction of the decoding circuit 23 can be simplified significantly, as the decoding circuit does not have to disable the voltage generators that are not selected.

Figure 4:
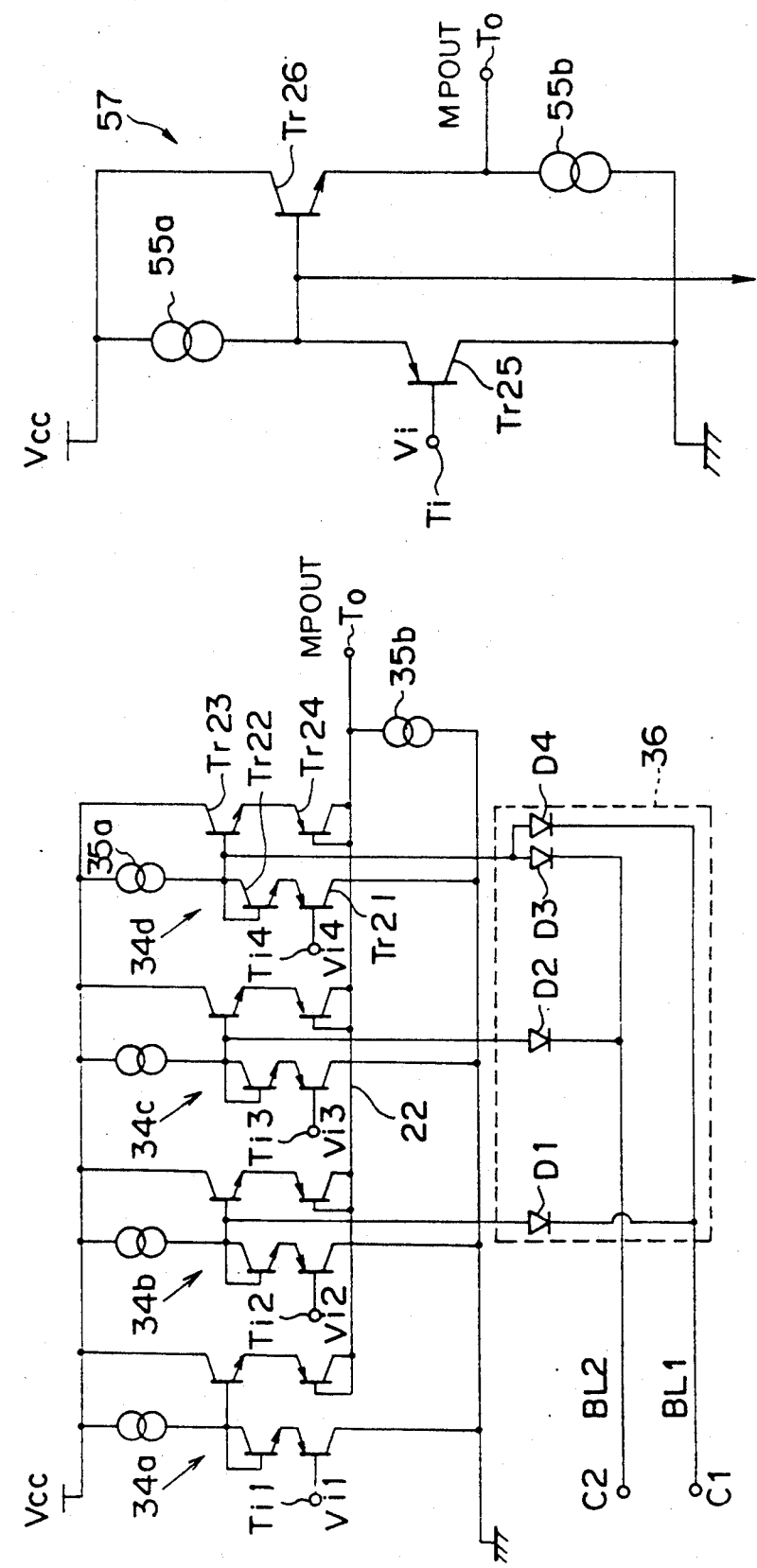
FIG. 4 is a circuit diagram showing the multiplexer for use in the system of FIG. 1 according to a first embodiment of the present invention.

FIG. 4 shows a first embodiment of the present invention. For the sake of simplicity of explanation, the circuit of FIG. 4 shows the case where there are only four voltage generators $34a$–$34d$ in correspondence to four levels $V_{i1}$–$V_{i4}$ of the output voltage.

Referring to FIG. 4, there are four input terminals $T_{i1}$–$T_{i4}$, respectively in correspondence to the four voltage generators $34a$–$34d$, for receiving the voltages $V_{i1}$–$V_{i4}$. Here, the voltages $V_{i1}$–$V_{i4}$ are set to satisfy the relationship $$V_{i1}<V_{i2}<V_{i3}<V_{i4}.$$

As the voltage generators $34a$–$34d$ have an identical construction, only the voltage generator $34d$ will be described.

The voltage generator $34d$ has a first PNP transistor Tr21 having a base connected to the input terminal $T_{i4}$ for receiving the voltage $V_{i4}$. The transistor Tr21 has a collector connected to the ground and an emitter connected to an emitter of a first NPN transistor Tr22 that acts as a current source of the PNP transistor Tr21. For this purpose, the NPN transistor Tr22 has a base and a collector connected commonly. Further, the base and the collector of the transistor Tr22 are connected to the voltage source Vcc via a constant current source $35a$. Thereby, the transistors Tr21 and Tr22 are both turned on in response to the voltage $V_{i4}$ at the input terminal $T_{i4}$. It should be noted that the level of the voltage $V_{i4}$ is set lower than the voltage Vcc at least by the threshold voltage of the transistors Tr21 and Tr22.

The voltage generator $34d$ further includes a second NPN transistor Tr23 and a second PNP transistor Tr24, wherein the transistor Tr23 has a base connected to the collector of the NPN transistor Tr22, a collector connected to the voltage source Vcc, and an emitter connected to an emitter of the PNP transistor Tr24. The transistor Tr24 has a base and a collector connected commonly to the output line 22. The output line 22, in turn, is connected to the ground via a current source $35b$.

In this construction, the collector current of the transistor Tr23 changes inversely proportional to the collector current of the transistor Tr21. Thereby, a voltage identical with $V_{i4}$ at the terminal $T_{i4}$ is obtained at the collector of the transistor Tr24 connected to the line 22 due to the threshold voltage of the transistors Tr23 and Tr24, when the transistors Tr22 and Tr23 are turned on in response to the voltage $V_{i4}$. For this purpose, the threshold voltages of the transistors Tr23 and Tr24 are set generally equal to the threshold voltages $V_{th}$ of the transistors Tr21 and Tr22, respectively. It should be noted that there is a voltage drop, determined by the threshold voltages of the transistors Tr21 and Tr22, across the source voltage Vcc and the base of the transistor Tr21, while the same voltage drop appears across the collector of the transistor Tr23 and the base of the transistor Tr24, ignoring the voltage drop across the constant current source 35a.

The voltage generators 34a–34d are controlled by a decoder 36 in response to the control data CONTROL at the input terminals $c_1$ and $c_2$. As the circuit of FIG. 4 has only four voltage generators 34a–34d, there are only two input terminals $c_1$ and $c_2$.

The decoder 36 includes therein bit lines BL1 and BL2 respectively connected to the input terminals $c_1$ and $c_2$, wherein the bit line BL1 is connected to the base of the transistor Tr23 via a diode D4 while the bit line BL2 is connected to the base of the transistor Tr23 via a diode D3. Thus, when there is a low level signal on one or both of the bit lines BL1 and BL2, the base voltage of the transistor Tr23 is forcefully decreased and the voltage generator 34d is disabled. On the other hand, when there are high level signals on the bit lines BL1 and BL2, the transistor Tr23 is not disabled and the voltage $V_{i4}$ is outputted on the line 22. In other words, the voltage generator 34d is enabled only when there are high level signals on both of the bit lines BL1 and BL2.

Similarly, the voltage generator 34c has an NPN transistor corresponding to the transistor Tr23 of the voltage generator 34d, the base of which is connected to the bit line BL2 via a diode D2. Thereby, the voltage generator 34c is enabled whenever there is a high level signal on the bit line BL2. The logic level of the signal on the bit line BL1 does not affect the operation of the voltage generator 34c. When the level of the signal on the bit line BL2 is low, on the other hand, the voltage generator 34c is disabled irrespective of the logic level of the signal on the bit line BL1.

Similarly, the voltage generator 34b has an NPN transistor corresponding to the transistor Tr23 of the voltage generator 34d, the base of which is connected to the bit line BL1 via a diode D1. Thereby, the voltage generator 34b is enabled whenever there is a high level signal on the bit line BL1. On the other hand, whenever there is a low level signal on the bit line BL1, the voltage generator 34b is disabled.

Voltage generator 34a is always enabled, regardless of the high or low values of the signals on the bit lines BL1 and BL2.

In operation, when there are high level signals on the bit lines BL1 and BL2, the voltage generators 34a–34d are all enabled and the voltages $V_{i1}$, $V_{i2}$, $V_{i3}$ and $V_{i4}$ are outputted on the line 22 simultaneously. Thereby, the highest voltage $V_{i4}$ is obtained at the output terminal TO as the voltage MPOUT. When there is a low level signal on the bit line BL1 and a high level signal on the bit line BL2, the voltage generators 34b and 34d are disabled, and the voltage generators 34a and 34c are enabled and output the voltages $V_{i1}$ and $V_{i3}$ simultaneously on the line 22. Thereby, the voltage $V_{i3}$ that is higher than $V_{i1}$ is obtained at the output terminal TO as the voltage MPOUT. On the other hand, when there is a low level signal on the bit line BL2 and a high level signal on the bit line BL1, the voltage generators 34c and 34d are disabled and the voltage generators 34a and 34b are enabled and output the voltages $V_{i1}$ and $V_{i2}$ on the line 22. Thereby, the voltage $V_{i2}$ that is higher than $V_{i1}$ is obtained at the output terminal TO. Further, when there is a low level signal on the both bit lines BL1 and BL2, the voltage generators 34b–34d are all disabled and the voltage $V_{i1}$ produced by the voltage generator 34a, which remains enabled at all times, is obtained at the output terminal TO as the voltage MPOUT.

Figure 1:
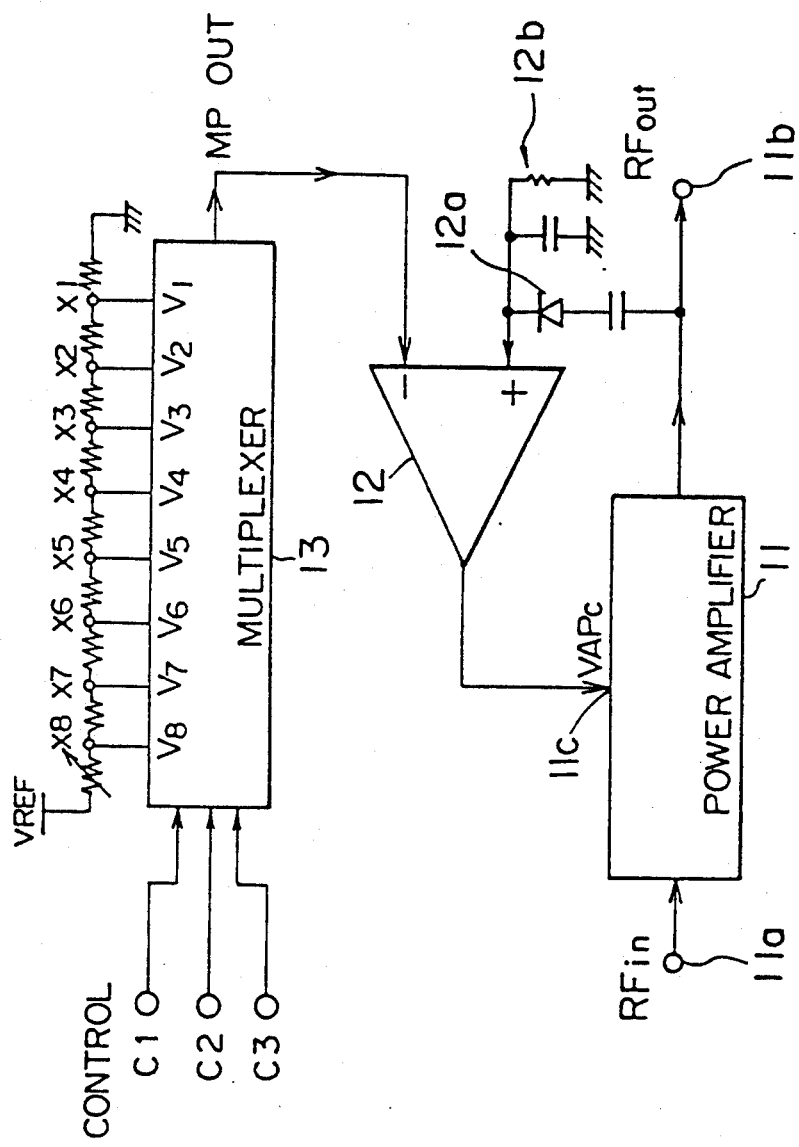
FIG. 1 is a block diagram showing the overall construction of an RF power amplifying system with controlled gain to which the present invention is to be applied.
Figure 2:
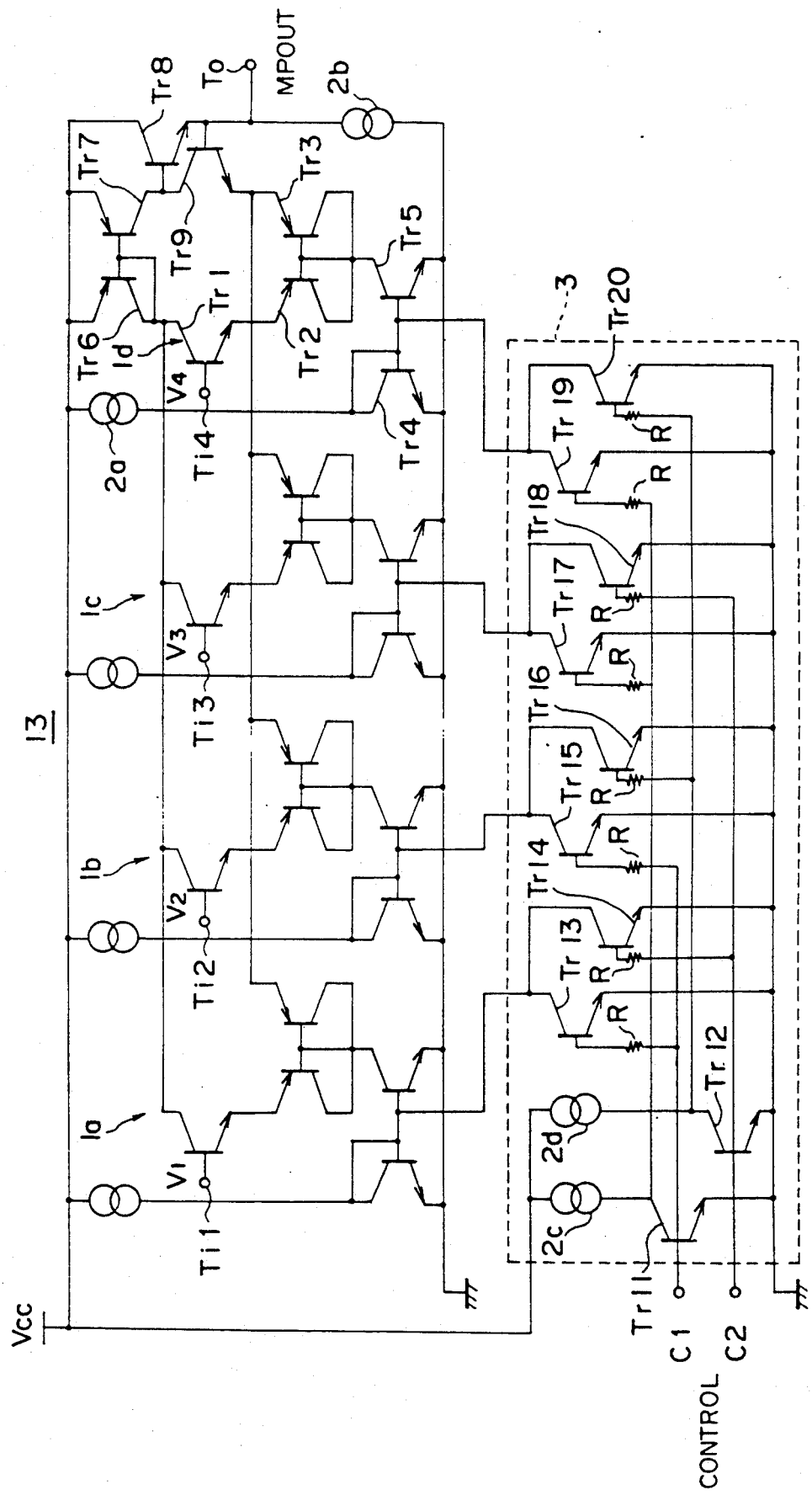
FIG. 2 is a circuit diagram showing a conventional multiplexer that is used in the system of FIG. 1.

In the foregoing operation, it should be noted that the enabling of the voltage generators that produce the lower voltages than the desired voltage is allowed. For example, the enabling of the voltage generators 34a–34c is allowed when obtaining the voltage $V_{i4}$ from the voltage generator 34d, contrary to the conventional case wherein these voltage generators had to be disabled. Thereby, the construction of the decoder 36 is significantly simplified by merely connecting the base of the transistor Tr23 of the respective voltage generators to the appropriate bit lines. Reference should be made to the prior art circuit of FIG. 2 that uses the transistors Tr11–Tr20 for the selective enabling of the voltage generator circuits 1a–1d. In the FIG. 2 circuit, therefor, enabling of only one voltage generator circuit is allowed at a time.

The foregoing advantageous feature of the present invention is clearly demonstrated when one expands the circuit of FIG. 4 to obtain the output voltage MPOUT selected from more than four voltage levels.

Figure 5:
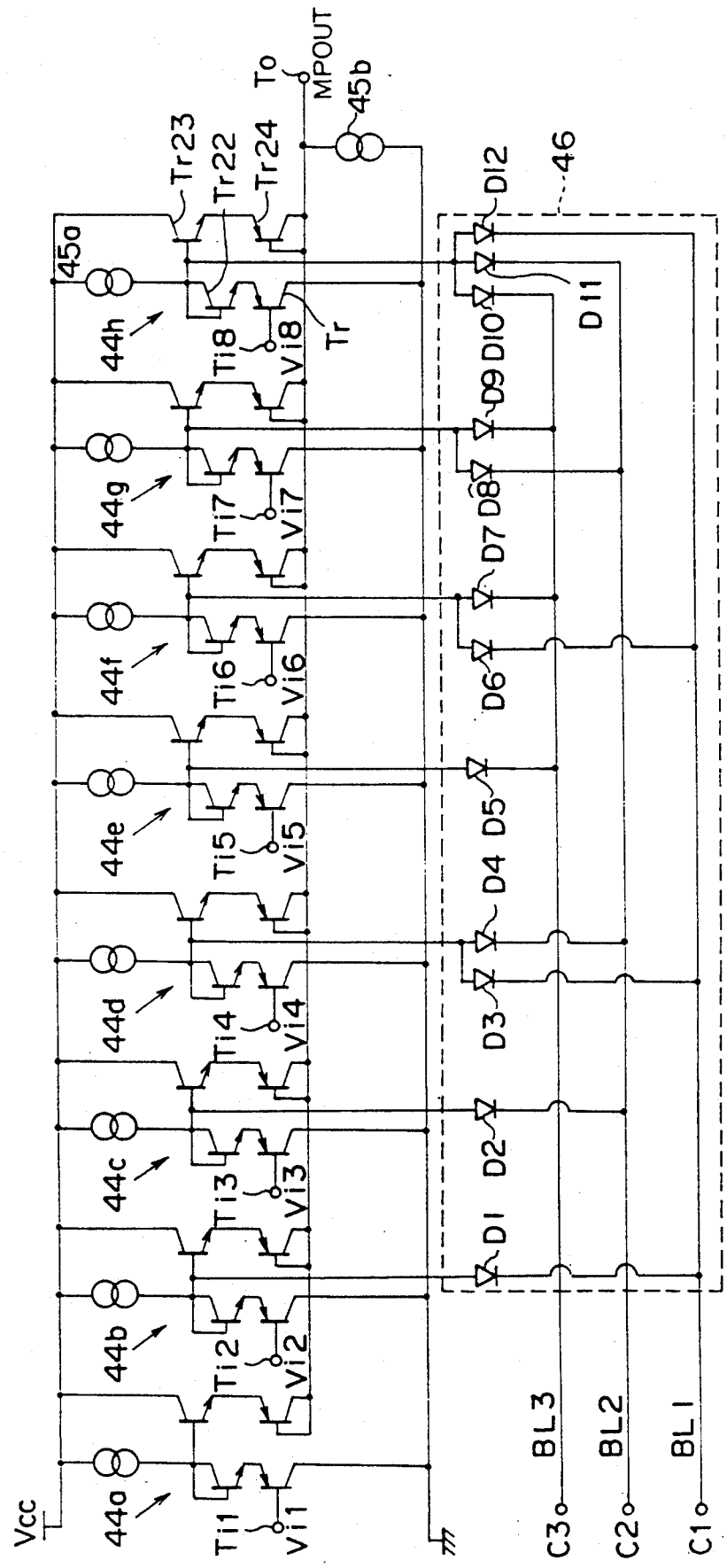
FIG. 5 is a circuit diagram showing the multiplexer according to a second embodiment of the present invention.

FIG. 5 shows a second embodiment of the present invention that is designed to produce the output voltage MPOUT with the level selected from eight different levels, $V_{i1}$–$V_{i8}$. In correspondence to this, there are eight voltage generators 44a–44h and a decoder 46 that includes three bit lines BL1–BL3 respectively in connection to the input terminals $c_1$–$c_3$. As each voltage generator has the construction identical with those described previously, the description of each voltage generator will be omitted.

In this case, too, the voltage generator 44h that produces the highest voltage $V_{i8}$ is connected to each of the three bit lines BL1–BL3 via respective diodes D12, D11 and D10. Similarly, the voltage generator 44g is connected to the bit lines BL2 and BL3 via diodes D8 and D9, the voltage generator 44f is connected to the bit lines BL1 and BL3 via diodes D6 and D7, the voltage generator 44e is connected to the bit line BL3 via a diode D5, the voltage generator 44d is connected to the bit lines BL1 and BL2 via diodes D3 and D4, the voltage generator 44c is connected to the bit line BL2 via a diode D2, and the voltage generator 44b is connected to the bit line BL1 via a diode D1. As the enabling of the voltage generators in response to the control data CONTROL supplied to the input terminals $c_1$–$c_3$ is obvious from the description of the first embodiment, further description will be omitted. Obviously, the present invention has an advantageous feature in that the number of parts needed for the decoder 46 is reduced significantly as compared to the prior art.

FIG. 6 shows a third embodiment of the present invention, wherein each of the voltage generators 34a–34e of FIG. 4 is replaced by a circuit 57 that includes a transistor Tr25 having a base connected to an input terminal $T_i$ for receiving an external reference voltage $V_i$, a collector connected to the voltage source Vcc via a constant current source 55a and an emitter connected to the ground. Further, the circuit 57 includes a transistor Tr26 that has a base connected to the emitter of the transistor Tr25, a collector connected to the voltage source Vcc, and an emitter connected to the ground via a constant current source 55b. The output of the circuit 57 is obtained at the emitter of the transistor Tr26. Further, the circuit 57 is disabled by reducing the voltage level of the base of the transistor Tr26 via a corresponding diode connecting element (generally indicated by an arrow in FIG. 6), similarly to the case of the first and second embodiments. In this case, too, the collector current of the transistor Tr26 is generally inversely proportional to the collector current of the transistor Tr25.

It should be noted that this circuit includes a reduced number of parts that is reduced further as compared to the first and second embodiments. On the other hand, this circuit may show a deviation in the voltage MPOUT obtained at the output terminal To from the voltage $V_i$, due to the possible variation in the base-emitter voltage of the PNP transistor Tr25 and the NPN transistor Tr26. It should be noted that the embodiment of FIG. 4 uses the NPN transistor TR22 in series with the PNP transistor Tr21 and likewise uses the PNP transistor Tr24 in series with the NPN transistor Tr23 for compensating for the variation of the threshold voltages in the PNP transistor and the NPN transistor. Thus, this circuit of FIG. 6 is suited for the case where the accuracy of the voltage MPOUT is not critical.

Further the present invention is not limited to the embodiments described heretofore, but various variations and modifications may be made without departing from the scope of the invention.

What is claimed is:

1. A multiplexer circuit for producing, at an output terminal thereof, an output voltage having a selected one of a plurality of different voltage levels, selected in response to and as designated by a control data signal supplied as an input to the circuit, comprising:
   voltage generation means, normally enabled, for producing a plurality of output voltages respectively of the plurality of different voltage levels, the plurality of output voltages being related in ascending order, from the lowest to the highest, of the corresponding, different voltage levels thereof;
   means, responsive to a received control data signal and the thereby designated voltage level of the output voltage to be produced, for individually and selectively disabling the production of each voltage output of the voltage generation means having a corresponding voltage level which is of a higher order than the voltage level of the output voltage designated by the control data signal; and
   means for receiving and supplying to the output terminal, in common, the plurality of output voltages produced by the voltage generation means, the voltage level of the output voltage produced at the output terminal of the multiplexer circuit accordingly being determined by the corresponding voltage level of the highest ordered voltage output, of the plurality of voltage outputs of the voltage generating means, which is not disabled by the disabling means in response to and in accordance with the received control data signal.

2. A multiplexer circuit as claimed in claim 1, wherein said voltage generating means produces the lowest ordered voltage output, and thus having the lowest corresponding voltage level, independently of the control data signal input to the circuit.

3. A multiplexer circuit as claimed in claim 1, wherein:
   said voltage generation means comprises a plurality of individual voltage generation circuits having a corresponding plurality of output connection and producing a corresponding plurality of output voltages respectively of the plurality of different voltage levels, the individual voltage generation circuits being related in ascending order, from the lowest to the highest, in accordance with the respective voltage levels of the corresponding output voltages produced thereby and each thereof, from at least the next-to-lowest ordered and up to and including the highest ordered, having a corresponding disabling input terminal;
   the control data input signal comprising a plurality of binary logic bit signals each bit signal being selectively of a first or a second logic level in accordance with the plurality of binary logic bit signals designating, in an ascending order from the lowest to the highest, the voltage level of the output voltage to be produced at the output terminal of the multiplexer circuit; and
   the disabling means comprising a decoder circuit and means, individually associated with the disabling input terminals of the plurality of voltage generation circuits, for selectively interconnecting the corresponding disabling input terminals thereof to the respectively associated bit lines in response to each bit signal of the first logic level received on a respectively associated bit line, and thereby supplying a disabling signal to the disabling input terminal respectively associated with the bit line.

4. A multiplexer circuit for producing, at an output terminal thereof, an output voltage having a selected one of a plurality of different voltage levels, selected in response to and in accordance with a control data signal supplied as an input to the circuit and designating the voltage level of the output voltage to be produced, comprising:
   a plurality of voltage generation circuits producing, at corresponding output connections thereof, a corresponding plurality of output voltages respectively of the plurality of different voltage levels, the plurality of voltage generation circuits being ordered in sequence, from the lowest to the highest of the corresponding voltage levels of the respective output voltages thereof;
   a common output line connected to the output terminal and to which the output connections of the plurality of voltage generation circuits are connected; and
   a decoder circuit, responsive to the control data input and the thereby designated voltage level of the voltage output, for producing a disabling signal for, and supplying the disabling signal to, each voltage generation circuit of a higher order than the voltage generation circuit producing the output voltage of the voltage level designated by the control data signal, the output voltage level of the output voltage produced on the common output line and thereby at the output terminal being defined by the voltage level of the output voltage of the highest ordered and not disabled voltage generation circuit.

5. A multiplexer circuit as claimed in claim 4, wherein
   the plurality of voltage generation circuits are respectively designated by a plurality of binary codes having respective numerical values ordered in a common sequence with the ordering of the plurality of voltage generation circuits;
   the control data signal comprises a plurality of binary logic bits, selectively of first and second logic levels and defining in a corresponding and commonly ordered sequence, from lowest to highest, the plurality of different voltage levels of the output voltage as selectively designated by the control data signal, each of the voltage generation circuits, from at least the next-to-lowest to the highest thereof, having a disabling input terminal; and said decoder circuit further comprises:

a plurality of bit lines for respectively receiving the plurality of binary logic bit signals of the control data signal, and a plurality of interconnection circuits respectively connecting the corresponding disabling input terminals of the plurality of voltage generation circuits to respectively associated ones of the plurality of bit lines in accordance with the commonly ordered sequence of the plurality of voltage generation circuits and of the plurality of voltage levels of the output voltage as selectively designated by the control data signal, each interconnection circuit including an associated diode for completing connection of the interconnection circuit to each respectively associated bit line in accordance with the logic bit thereon having a first logic level and correspondingly producing a disabling input to the disabling input terminal of the respective voltage generation circuit to thereby disable the respective voltage generation circuit.

6. A multiplexer circuit as claimed in claim 4, wherein the corresponding output connection of the lowest-ordered voltage generation circuit is connected to the common output line for producing the respective output voltage thereof on the common output line, independently of the logic levels of the plurality of binary logic bits of the control data signal.

7. A multiplexer circuit as claimed in claim 6 wherein the lowest ordered voltage generation circuit is not connected to any of the bit lines of the decoder circuit.

8. A multiplexer circuit as claimed in claim 4 wherein a reference voltage is supplied to each of the voltage generation circuits having a voltage level corresponding to the corresponding voltage level of the respective output voltage thereof, each of said voltage generation circuits further comprising:

a first bipolar transistor having a base connected for receiving the corresponding reference voltage supplied thereto, an emitter connected to ground potential and a collector, the first bipolar transistor being turned on in response to the corresponding reference voltage supplied thereto at the base thereof, a constant current source connected to a voltage source for supplying a current of a predetermined current level, a second bipolar transistor connected to the first bipolar transistor and acting as a current source therefor, the second bipolar transistor having a base and a collector connected in common and receiving a power voltage applied thereto through the first bipolar transistor acting as a constant current source and an emitter connected to the collector of the first bipolar transistor for driving the first bipolar transistor by producing a flow of collector current therethrough, a third bipolar transistor having a base connected to the collector of the second bipolar transistor, a collector connected to the voltage source and an emitter, the third bipolar transistor producing a flow of collector current from the collector to the base thereof having a magnitude inversely proportional to the collector current of the first bipolar transistor, and a fourth bipolar transistor having a base and an emitter connected in common to the common output line and an emitter connected to the emitter of the third bipolar transistor, the fourth bipolar transistor acting as the current source of the third bipolar transistor, the decoder further comprising one or more diodes provided in correspondence to one or more of the bit lines for connecting the base of the third bipolar transistor to respective bit lines, each of said diodes diverting the base current of the third bipolar transistor in accordance with the logic bit signal on the bit line of the decoder to which the diode is connected having the first logic level and thereby disabling the associated voltage generator circuit.

9. A multiplexer circuit as claimed in claim 8 wherein each of the first and fourth bipolar transistor comprises a PNP transistor, and each of said second and third bipolar transistors comprises an NPN transistor.

10. A multiplexer circuit as claimed in claim 8 in which each of said diodes has an anode connected to the base of the third bipolar transistor and a cathode connected to the corresponding bit line.

11. A multiplexer circuit as claimed in claim 4 in which each of said voltage generator circuits is supplied with a predetermined input voltage corresponding to the output voltage that the voltage generator produces, each of said voltage generator circuits further comprising a first bipolar transistor having a base connected for receiving the predetermined input voltage, an emitter connected to the ground and a collector, the first bipolar transistor being turned on in response to receiving the predetermined input voltage at the base thereof, a first constant current source having a first terminal connected to a voltage source and having a second terminal connected to the collector of the first bipolar transistor and supplying a current of a predetermined current level to the first bipolar transistor, and a second bipolar transistor having a base connected to the collector of the first bipolar transistor, a collector connected to the voltage source, and an emitter, a second constant current source having a first terminal connected to the emitter of the second bipolar transistor and having a second terminal connected to ground, the emitter of the second bipolar transistor being connected to the common output line.

* * * * *